(12) United States Patent
Yu et al.

(10) Patent No.: US 7,838,946 B2
(45) Date of Patent: Nov. 23, 2010

(54) METHOD FOR FABRICATING SEMICONDUCTOR STRUCTURE AND STRUCTURE OF STATIC RANDOM ACCESS MEMORY

(75) Inventors: Chih-Hao Yu, Tainan County (TW);
Li-Wei Cheng, Hsinchu (TW);
Che-Hua Hsu, Hsinchu County (TW);
Tian-Fu Chiang, Taipei (TW);
Cheng-Hsien Chou, Tainan (TW);
Chien-Ming Lai, Tainan County (TW);
Yi-Wen Chen, Tainan County (TW);
Chien-Ting Lin, Hsinchu (TW);
Guang-Hwa Ma, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 372 days.

(21) Appl. No.: 12/058,208

(22) Filed: Mar. 28, 2008

(65) Prior Publication Data
US 2009/0242997 A1    Oct. 1, 2009

(51) Int. Cl.
*H01L 29/76* (2006.01)
(52) U.S. Cl. .................. 257/379; 257/381; 257/E27.098

(58) Field of Classification Search ......... 257/379–381,
257/E27.098
See application file for complete search history.

(56) References Cited

U.S. PATENT DOCUMENTS

| 6,573,134 B2 | 6/2003 | Ma et al. |
| 7,153,784 B2 | 12/2006 | Brask et al. |
| 7,750,416 B2 * | 7/2010 | Lee et al. ............ 257/391 |

* cited by examiner

*Primary Examiner*—H. Jey Tsai
(74) *Attorney, Agent, or Firm*—Winston Hsu; Scott Margo

(57) ABSTRACT

A method for fabricating a semiconductor structure is disclosed. A substrate with a first transistor having a first dummy gate and a second transistor having a second dummy gate is provided. The conductive types of the first transistor and the second transistor are different. The first and second dummy gates are simultaneously removed to form respective first and second openings. A high-k dielectric layer, a second type conductive layer and a first low resistance conductive layer are formed on the substrate and fill in the first and second openings, with the first low resistance conductive layer filling up the second opening. The first low resistance conductive layer and the second type conductive layer in the first opening are removed. A first type conductive layer and a second low resistance conductive layer are then formed in the first opening, with the second low resistance conductive layer filling up the first opening.

7 Claims, 8 Drawing Sheets

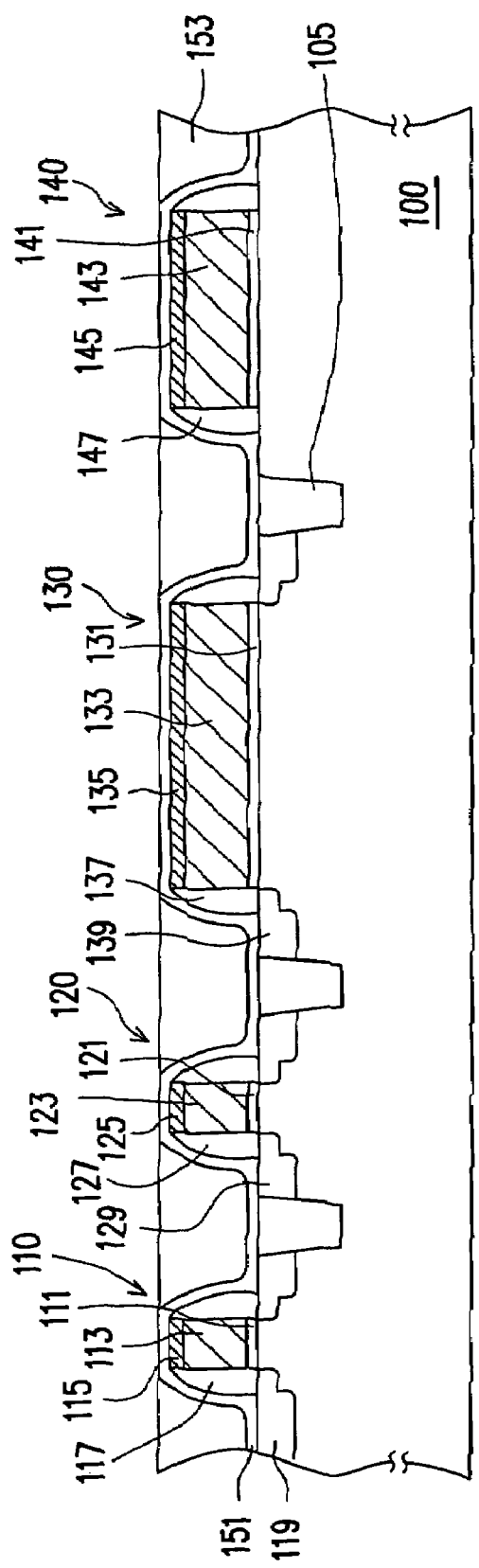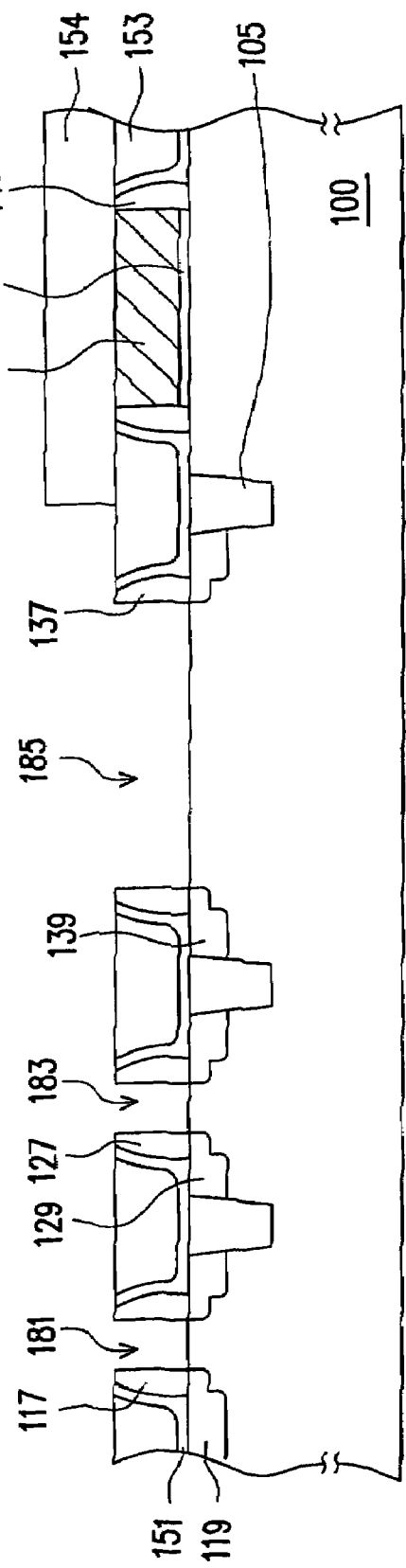

METHOD FOR FABRICATING SEMICONDUCTOR STRUCTURE AND STRUCTURE OF STATIC RANDOM ACCESS MEMORY

BACKGROUND OF THE INVENTION

1. Field of the Invention

The present invention relates to a static random access memory and a method for fabricating a semiconductor structure, and more particularly, to a static random access memory with a high-k dielectric layer and a method for fabricating a semiconductor structure with a high-K dielectric layer.

2. Description of Related Art

In a traditional semiconductor process, silicon dioxide is usually used to form a gate dielectric layer. However, with rapid development in the integrated circuit industry, to increase the integrity and driving capacity of elements, the whole circuit element must be designed with reduced profile. As line width of the gate is narrowed, the thickness of the gate dielectric layer must also be reduced. This may increase the possibility of direct tunneling, which may result in sudden increase of the gate leakage current.

To address this issue, dielectric layer with high-k becomes attractive for being used as the gate dielectric layer material. However, currently, there are still technical difficulties in incorporating the high-k dielectric layer into the transistor. This is because the use of high-k dielectric material may reduce the migration rate and element reliability. In addition, as the gate dielectric layer is getting thinner, Boron penetration and poly depletion become more serious. The Boron penetration can be mitigated by doping a tiny amount of nitrogen into the oxide, but the ploy depletion cannot be avoided. Further, since the use of the high-k dielectric layer may increase the threshold voltage of the element, the high-k dielectric layer and the polysilicon gate cannot be integrated together. Accordingly, it is proposed to replace the polysilicon with metal gate, which facilitates avoiding the poly depletion as well as reducing the gate parasitic resistance.

However, in conventional methods of forming a typical gate structure having the high-k dielectric layer and metal gate, the dummy polysilicon gate is removed after it is formed on the high-k dielectric layer, and a metal gate is formed later. This may cause the high-k dielectric layer to be damaged during the course of removing the dummy polysilicon gate, which would degrade its original property of high resistance.

Moreover, integrating the fabrication process of these elements having high-k dielectric layer and fabrication process of other elements on a chip may cause many problems on various elements. For example, the earlier formed high-k dielectric layer and metal gate will be subjected to multiple high temperature thermal processes, which may change the original properties of these layers. For example, this may degrade the quality of the interface between the high-k dielectric layer and the metal gate, which may easily, especially in a P-type transistor, cause roll-off of a threshold voltage of the transistor, reducing the element reliability. Another problem may be that an extra high-k dielectric layer is formed at the PN interface of the static random access memory, which significantly reduces the performance of the static random access memory.

SUMMARY OF THE INVENTION

The present invention is directed to a method for fabricating a semiconductor structure in which the high-k dielectric layer is formed after removal of the dummy gate, thereby avoiding the layer quality degradation due to the high temperature thermal processes.

The present invention is also directed to a static random access memory having no extra high-k dielectric layer being disposed at the PN interface while keeping the advantageous of the high-k dielectric layer.

The present invention provides a method for fabricating a semiconductor structure. In this method, a substrate with a first transistor comprising a first dummy gate and a second transistor comprising a second dummy gate is first provided. The conductive type of the first transistor is different from a conductive type of the second transistor. The first dummy gate and the second dummy gate are then simultaneously removed to form a first opening and a second opening, respectively. Next, a dielectric layer, a high-k dielectric layer, a second type conductive layer and a first low resistance conductive layer are formed on the substrate in sequence and at least fill in the first opening and the second opening, with the first low resistance conductive layer filling up the first opening and the second opening. Afterwards, the first low resistance conductive layer and the second type conductive layer in the first opening are removed. Next, a first type conductive layer and a second low resistance conductive layer are formed in the first opening, with the second low resistance conductive layer filling up the first opening.

According to one embodiment of the present invention, the substrate further comprises a high-voltage element, a resistor and a static random access memory that have been formed on the substrate, the high-voltage element comprises a gate, the resistor comprises an upper electrode, the static random access memory comprises a conductive layer extending across a first type doped region, an isolation structure and a second type doped region that are formed in the substrate.

According to one embodiment of the present invention, the gate and the conductive layer are removed along with removal of the first dummy gate and the second dummy gate.

According to one embodiment of the present invention, during forming the dielectric layer, the high-k dielectric layer, the second type conductive layer and the first low resistance conductive layer, these layers simultaneously fill into the location where the gate and the conductive layer were located.

According to one embodiment of the present invention, along with removing the first low resistance conductive layer and the second type conductive layer in the first opening, the first low resistance conductive layer and the second type conductive layer in the static random access memory that are located above the first type doped region are removed to form a third opening.

According to one embodiment of the present invention, during forming the first type conductive layer and the second low resistance conductive layer, the first type conductive layer and the second low resistance layer fill in the third opening, with the second low resistance conductive layer filling up the third opening.

According to one embodiment of the present invention, the method for removing the first dummy gate and the second dummy gate comprises a wet etching process or a dry etching process.

According to one embodiment of the present invention, the wet etching process comprises using $NH_4OH$ or TMAH.

According to one embodiment of the present invention, the first transistor is a P-type transistor, and the second transistor is an N-type transistor.

According to one embodiment of the present invention, the first type conductive layer is a P-type metal layer and the second type conductive layer is an N-type metal layer.

According to one embodiment of the present invention, the method for removing the first low resistance conductive layer and the second type conductive layer in the first opening comprises first forming a patterned photoresist layer with at least an upper surface of the first low resistance conductive layer located above the first opening being exposed, and then removing at least the first low resistance conductive layer and the second type conductive layer in the first opening with a dry etching process or a wet etching process.

According to one embodiment of the present invention, the wet etching process comprises using deionized water including $NH_4OH$, $H_2O_2$, $H_2SO_4$ or HCl.

According to one embodiment of the present invention, before removing the first dummy gate and the second dummy gate, the method for fabricating the semiconductor structure further comprises forming a mask on the substrate, the mask covering the first transistor and the second transistor. Then, an interlayer dielectric layer is formed on the substrate, with the interlayer dielectric layer filling up at least a spacing between the first type transistor and the second type transistor. Afterwards, a portion of the mask is removed such that the first dummy gate and the second dummy gate are exposed.

The present invention also provides a static random access memory. The static random access memory comprises a substrate, an interlayer dielectric layer, a high-k dielectric layer, a first low resistance conductive layer, a second type conductive layer, a first type conductive layer and a second low resistance conductive layer. The substrate comprises a first type doped region, a second type doped region, and an isolation structure separating the first type doped region and the second type doped region apart. The interlayer dielectric layer is disposed on the substrate, and has an opening extending across the first type doped region, the isolation structure and the second doped region such that the substrate is exposed. The high-k dielectric layer is disposed in the opening along inner sidewalls and a bottom of the opening. The first low resistance conductive layer is disposed on the second type doped region and a portion of the isolation structure and fill in the opening. The second type conductive layer is disposed between the first low resistance conductive layer and the high-k dielectric layer. The first type conductive layer is disposed on the high-k dielectric layer along an exposed side surface of the first low resistance conductive layer and an exposed upper surface of the high-k dielectric layer in the opening. The second low resistance conductive layer is disposed on the first type conductive layer and fills in the opening.

According to one embodiment of the present invention, the static random access memory further comprises a dielectric layer disposed between the high-k dielectric layer and the substrate and between the high-k dielectric layer and the interlayer dielectric layer.

According to one embodiment of the present invention, the first type doped region is a P-type doped region, and the second type doped region is an N-type doped region.

According to one embodiment of the present invention, the first type conductive layer is a P-type conductive layer, and the second type conductive layer is an N-type metal layer.

According to one embodiment of the present invention, material of the P-type metal layer comprises tungsten, tungsten nitride, platinum, titanium nitride or ruthenium.

According to one embodiment of the present invention, material of the N-type metal layer comprises tantalum nitride, tantalum silicon nitride, tantalum carbide, titanium aluminum nitride, aluminum-titanium alloy, titanium aluminum compound, aluminum.

According to one embodiment of the present invention, material of the high-k dielectric layer comprises tantalum oxide, $Ba_{1-x}Sr_xTiO_3$, silicon nitride, silicon oxynitride, silicon carbide, silicon carbon oxide, hafnium oxide, hafnium silicon oxide, hafnium silicon oxynitride, zirconium oxide, zirconium silicon oxide, zirconium hafnium oxide, titanium oxide, cerium oxide, lanthanum oxide, lanthanum aluminum oxide, or aluminum oxide.

In the present invention, the sequence of the process steps is changed such that the high-k dielectric layer is formed after removal of the conductive layers of the dummy gate and the static random access memory, thereby preventing the layer from being damaged and improving the quality of the interface between the high-k dielectric layer and the first type conductive layer, or between the high-k dielectric layer and the second type conductive layer. In addition, no extra high-k dielectric layer will be formed at the PN interface of the static random access memory.

In order to make the aforementioned and other features and advantages of the present invention more comprehensible, embodiments accompanied with figures are described in detail below.

BRIEF DESCRIPTION OF THE DRAWINGS

FIGS. 1A-1 through 1F-1 are cross-sectional views illustrating fabrication process of a semiconductor structure according to one embodiment of the present invention.

FIGS. 1A-2 through 1F-2 are cross-sectional views illustrating fabrication process of a static random access memory corresponding to the steps of FIGS. 1A-1 through 1F-1.

DESCRIPTION OF THE EMBODIMENTS

Figures 1, 1C:
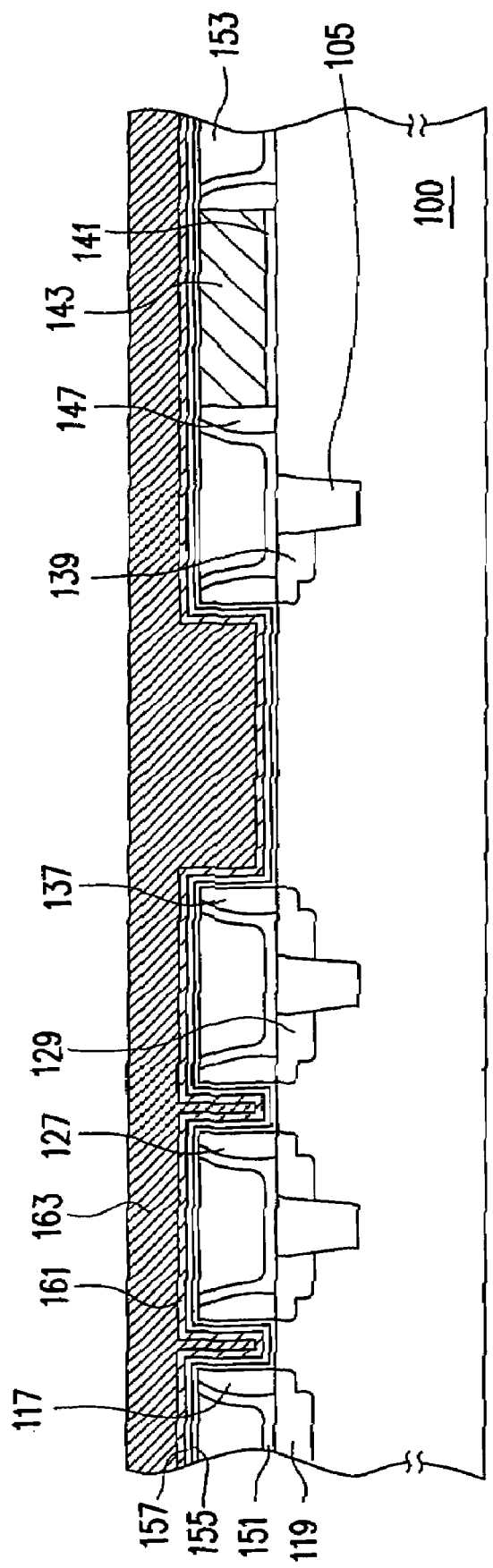
Figures 1, 1D:
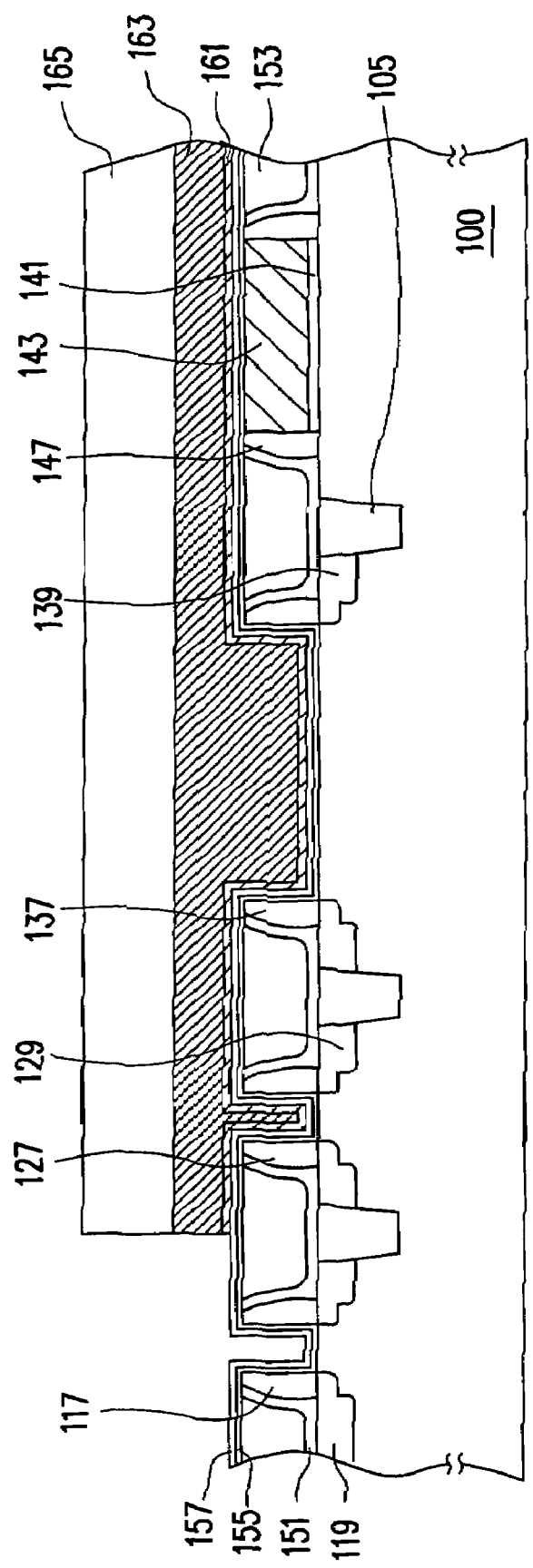
Figures 1, 1E:
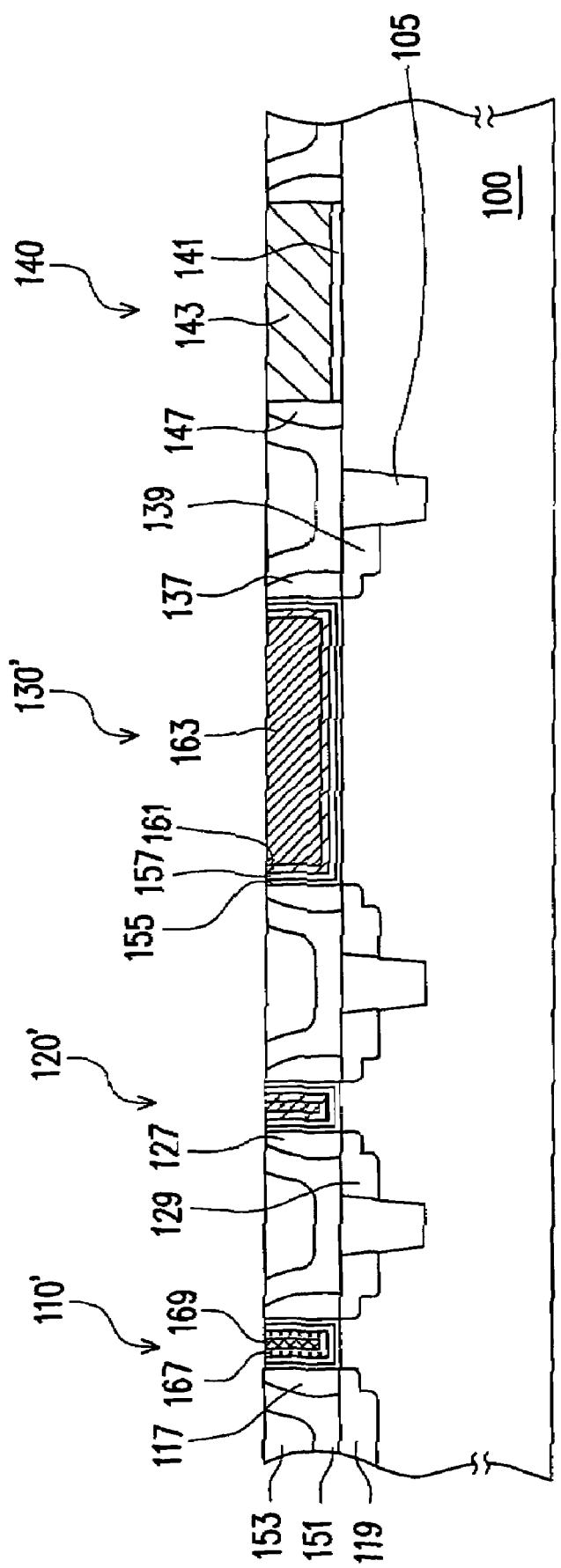
Figures 1, 1F:
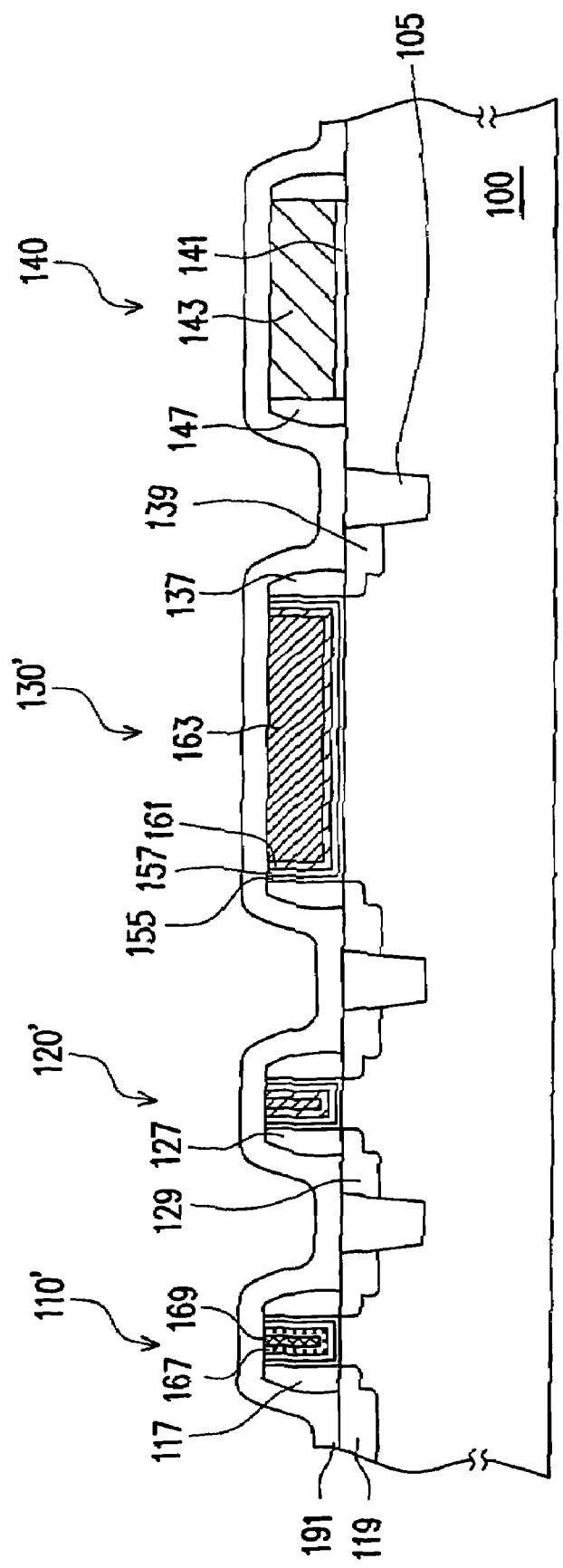
Figures 1, 1A, 2:
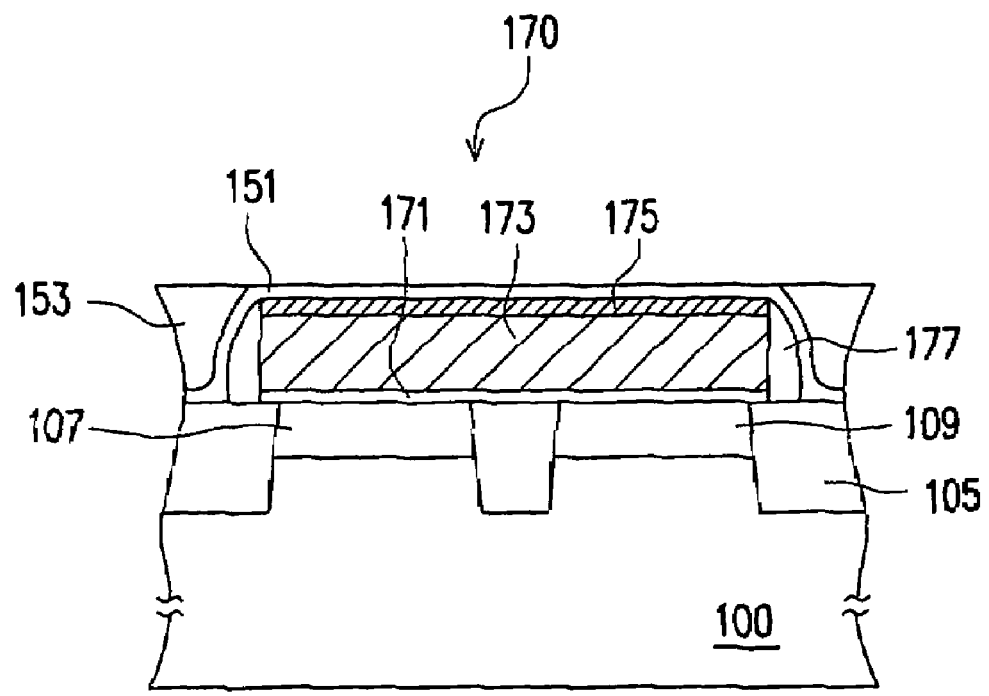

FIGS. 1A-1 through 1F-1 are cross-sectional views illustrating fabrication process of a semiconductor structure according to one embodiment of the present invention. FIGS. 1A-2 through 1F-2 are cross-sectional views illustrating fabrication process of a static random access memory corresponding to the steps of FIGS. 1A-1 through 1F-1.

FIG. 1A-1 illustrates a flow chart for fabricating a semiconductor structure according to one embodiment of the present invention. In the illustrated fabrication process, a substrate 100 is first provided. The substrate 100 is, for example, a silicon substrate, a silicon substrate on insulator, a III-V compound semiconductor substrate, or a II-VI compound semiconductor substrate. A first transistor 110, a second transistor 120, a high-voltage element 130 and a resistor 140, which are separated apart by isolation structures 105, have been formed on the substrate 100. The isolation structure 105 is, for example, a shallow trench isolation structure as shown in FIG. 1A-1, or other type of isolation structure such as a field oxide.

The first transistor 110 includes a gate dielectric layer 111 disposed on the substrate 100 and a dummy gate 113 disposed on the gate dielectric layer 111. A spacer 117 is disposed on both sides of the dummy gate 113. A first type source/drain region 119 is formed in the substrate 100 at opposite sides of the dummy gate 113. Material of the gate dielectric layer 111 is, for example, silicon oxide. Material of the dummy gate 113 is conductive material such as polysilicon, doped polysilicon, or the like. Material of the spacer 117 is insulating material, for example, silicon oxide. A hard mask layer 115, for example, silicide layer of nickel silicide, tungsten silicide, cobalt silicide or titanium silicide, etc. may also be disposed on the dummy gate 113. The first type drain/source 119 is formed in the substrate 100 at opposite sides of the dummy gate 113.

The second transistor 120 is constructed in a similar way as the first transistor 110, and includes a gate dielectric layer 121, a dummy gate 123, spacers 127 and a second type source/drain region 129. A hard mask layer 125 may also be disposed on the dummy gate 123.

The first type source/drain 119 is, for example, a P-type doped region that is doped with P-type dopant such as B, $BF_2$, In or the like, and the first transistor 110 is thus a P-type transistor. Correspondingly, the second type source/drain 129 is, for example, an N-type source/drain that is doped with N-type dopant such as P, As or the like, and the second transistor 120 is thus an N-type transistor.

The high-voltage element 130 is constructed in a similar way as the first transistor 110 and the second transistor 120, and includes a gate dielectric layer 131, dummy gate 133, spacer 137 and source/drain 139. A hard mask 135 may also be disposed on the dummy gate 133.

The resistor 140 includes a capacitor insulation layer 141 formed on the substrate 100 and an upper electrode 143. A hard mask layer 145 may also be disposed on the upper electrode 143. A spacer 147 may be disposed on two sides of the upper electrode 143.

In one embodiment, the first transistor 110, second transistor 120, high-voltage element 130 and resistor 140 are formed by same process steps at the same time. Materials of the gate dielectric layer 111, 121, 131, and the capacitor insulation layer 141 may be, for example, the same, and materials of the dummy gate 113, 123, 133 and the upper electrode 143 may be, for example, the same.

Referring to FIG. 1A-2, in one embodiment, aside from the first transistor 110, second transistor 120, high-voltage element 130 and resistor 140, a static random access memory 170 may further have been formed on the substrate 100. This static random access memory 170, for example, is disposed across a first type doped region 107, an isolation structure 105 and a second type doped region 109 which have been formed in the substrate. In one embodiment, the first type doped region 107 is, for example, a P-type doped region that is doped with P-type dopant such as B, $BF_2$, In or the like. The second type doped region 109 is, for example, an N-type doped region that is doped with N-type dopant such as P, As or the like. The static random access memory 170 includes a bottom dielectric layer 171, a conductive layer 173 and a hard mask layer 175, from the substrate 100 up. A spacer 177 is disposed on two sides of the conductive layer 173. These layers are formed by the same process steps as in the first transistor 110, the second transistor 120, the high-voltage element 130 and the resistor 140. Materials of the these layers may be the same as the materials of respective gate dielectric layer 111, dummy gate 113, hard mask layer 115 and spacer 117 as described above.

Referring to FIGS. 1A-1 and 1A-2, next, a mask 151 is formed on the substrate 100 to cover the first transistor 110, second transistor 120, high-voltage element 130, resistor 140 and static random access memory 170. Material of the mask 151 is, for example, silicon dioxide, silicon nitride, silicon oxynitride, silicon carbide, or silicon carbon nitride. The mask 151 is, for example, formed by chemical vapour deposition. The mask 151 may be a single layered structure or a multilayered structure. For example, the mask 151 may be a double layered structure including a bottom silicon oxide layer and a top silicon nitride layer. An interlayer dielectric layer 153 is then formed on the substrate 100, and the mask 151 is used as an etch stop layer to planarize the interlayer dielectric layer 153. Material of the interlayer dielectric 153 is, for example, silicon oxide, phosphosilicate glass, borophosphosilicate glass or other suitable dielectric materials.

The interlayer dielectric layer 153 is, for example, formed by chemical vapour deposition. Planarization of the interlayer dielectric layer 153i is performed, for example, by chemical mechanical polishing (CMP).

Figures 1, 1B, 2:
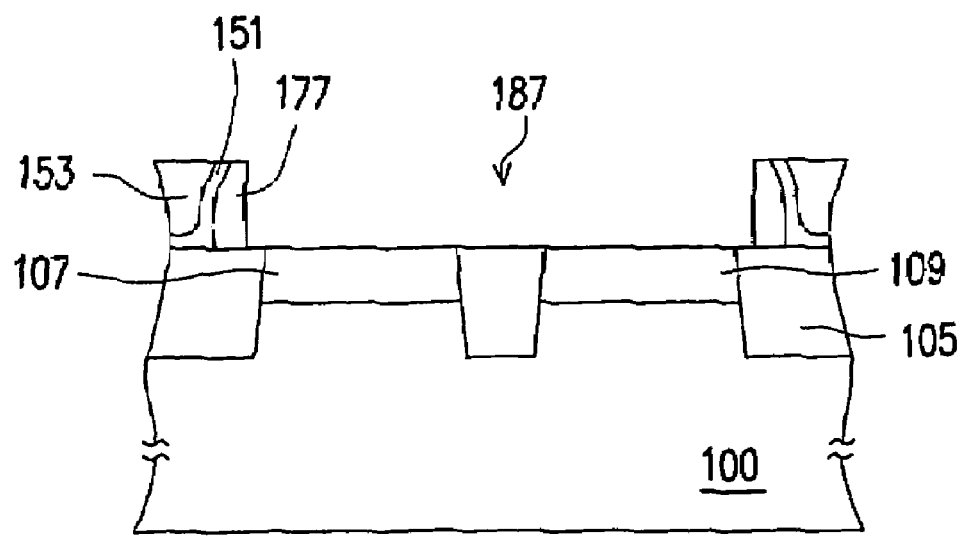
Figures 1, 1C, 2:
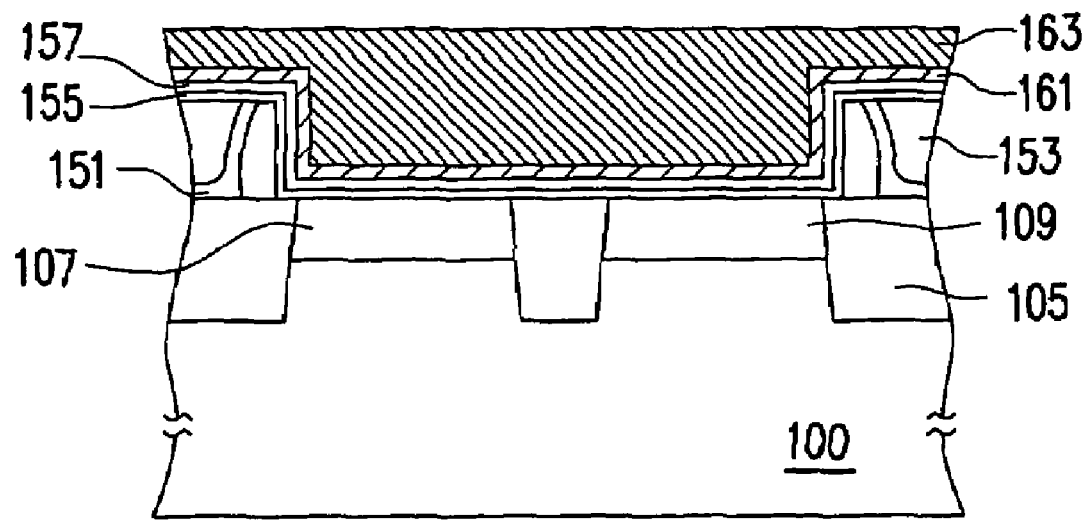
Figures 1, 1D, 2:
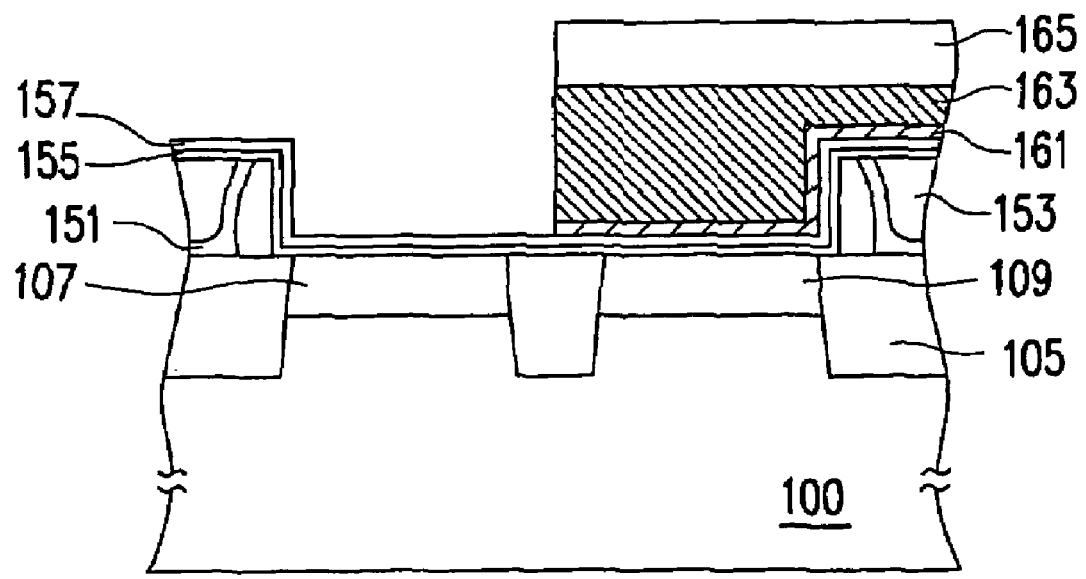
Figures 1, 1E, 2:
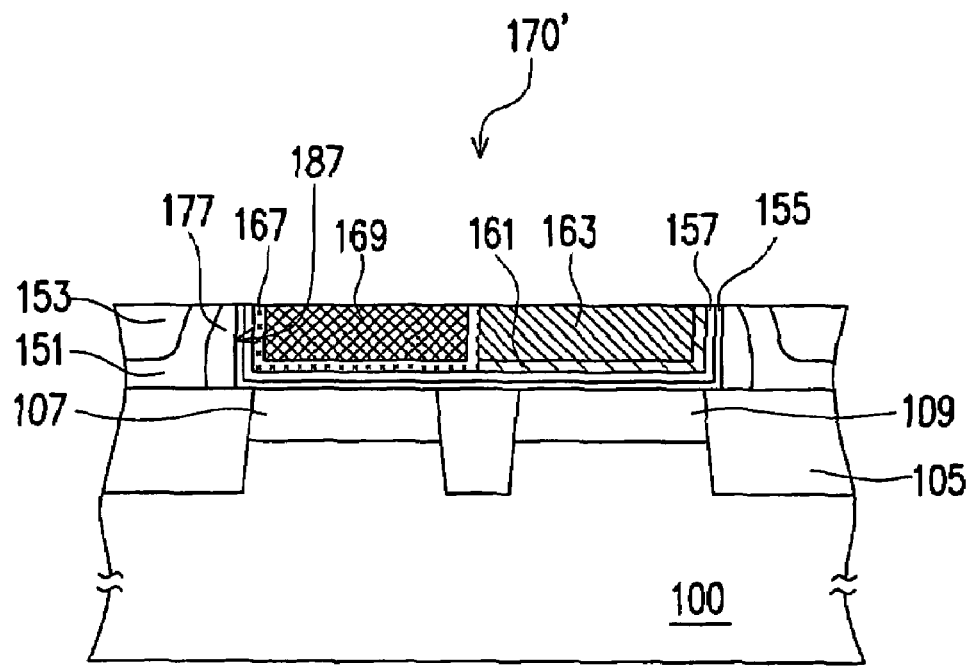
Figures 1, 1F, 2:
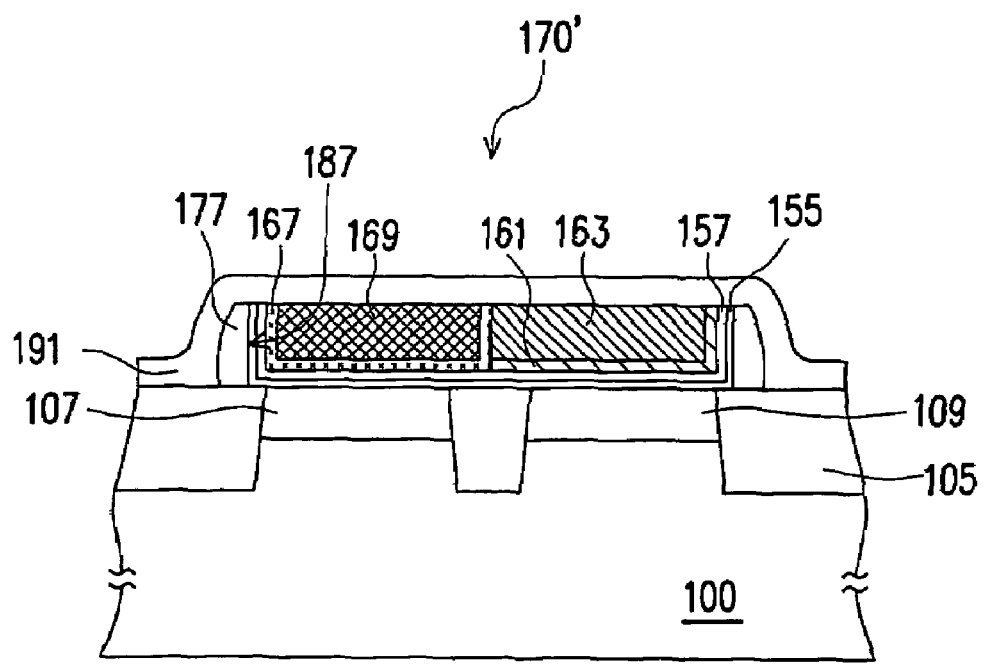

Afterwards, referring to FIGS. 1B-1 and 1B-2, a suitable method like etch-back is used to remove portions of the interlayer dielectric layers 153, mask 151 and hard mask layers 115, 125, 135, 145, 175, such that the dummy gates 113, 123, 133, upper electrode 143 and conductive layer 173 are exposed. Then, the exposed dummy gates 113, 123, 133 and conductive layer 173, and the gate dielectric layer 111, 121, 131 and the bottom dielectric layer 171 are removed to form openings 181, 183, 185, 187, with the upper electrode 143 remaining unchanged. To remove these layers, a positive photoresist layer is, for example, coated on the substrate 100. A patterned photoresist layer 154 covering the resistor 140 is formed on the substrate 100 by exposure and development of the positive photoresist layer. The exposed dummy gates 113, 123, 133 and conductive layer 173 are subsequently removed by dry etching process or wet etching process. The dry etching process is, for example, a reactive ion etching process, and the wet etching process may use etching solution such as $NH_4OH$ or TMAH.

Next, referring to FIGS. 1C-1 and 1C-2, the patterned photoresist layer 154 is removed, and subsequently, a dielectric layer 155, a high-k dielectric layer 157, a second type conductive layer 161 and a low resistance conductive layer 163 are formed on the substrate 100 in sequence. These layers fill in the openings 181, 183, 185, 187, with the low resistance conductive layer 163 filling up these openings.

In the above process, material of the dielectric layer 155 is, for example, silicon dioxide, and the dielectric layer 155 is formed by, for example, chemical vapour deposition. Material of the high-k dielectric layer 157 is, for example, tantalum oxide, $Ba_{1-x}Sr_xTiO_3$, silicon nitride, silicon oxynitride, silicon carbide, silicon carbon oxide, hafnium oxide, hafnium silicon oxide ($HfSi_xO_x$), hafnium silicon oxynitride (HfSiON), zirconium oxide ($ZrO_x$), zirconium silicon oxide ($ZrSi_xO_y$), zirconium hafnium oxide ($HfZr_xO_y$), titanium oxide, cerium oxide, lanthanum oxide, lanthanum aluminum oxide, or aluminum oxide. The high-k dielectric layer 157 is formed, for example, by chemical vapour deposition or sputtering. Material of the second type conductive layer 161 is, for example, an N-type metal with a work function between 4.0~4.2 eV, such as metals like, tantalum nitrite, tantalum silicon nitride, tantalum carbide, titanium aluminum nitride, aluminum-titanium alloy, aluminum. The conductive layer 161 is formed, for example, by chemical vapour deposition or sputtering. Material of the low resistance conductive layer 163 is, for example, tungsten, aluminum, aluminum-titanium (TiAl) or cobalt tungsten phosphide (CoWP).

Referring to FIGS. 1D-1 and 1D-2, a patterned photoresist layer 165 (or hard mask) is then formed on the low resistance conductive layer 163, such that the low resistance conductive layer 163 filling up the opening 181 and disposed above the first type source/drain 119 are exposed (referring to FIG. 1D-1), and the low resistance conductive layer 163 disposed above the first type doped region 107 is also exposed (referring to FIG. 1D-2). Afterwards, the low resistance conductive layer 163 and the second type conductive layer 161 in the opening 181 are removed, and, at the same time, the low resistance conductive layer 163 and the first type conductive layer 161 disposed above the first type doped region 107 are removed. Method for removing the low resistance conductive layer 163 and the second type conductive layer 161 include wet etching process and dry etching process. As to the wet etching process, an etching solution may be deionized water including NH₄OH, H₂O₂, H₂SO₄ or HCl mixed in an appropriate ratio. The dry etching process may be reactive ion etching process.

Next, the patterned photoresist layer 165 (or hard mask) is removed, and subsequently, a first type conductive layer 167 and another low resistance conductive layer 169 are formed in sequence. Material of the first type conductive layer 167 is, for example, P type metal with a working function between 4.9~5.1 eV, such as tungsten, tungsten nitride, platinum (nickel), titanium nitride (TiN), ruthenium (Ru). The first type conductive layer 167 is formed, for example, by chemical vapor deposition or sputtering. Material of the low resistance conductive layer 169 is, for example, tungsten, aluminum, aluminum-titanium (TiAl) or cobalt tungsten phosphide (COWP).

Referring to FIGS. 1E-1 and 1E-2, afterwards, a planarization process is performed to remove all layers above the interlayer dielectric layer 153. Removal of these layers can be accomplished by CMP in which the interlayer dielectric layer 153 is used as an etching stop layer and the excessive low resistance conductive layer 169, first type conductive layer 167, low resistance conductive layer 163, second type conductive layer 161 are removed simultaneously.

After the above processing is performed, a first type transistor 110', a second transistor 120', a high-voltage element 130' (referring to FIG. 1E-1) and a static random access memory 170' (referring to FIG. 1E-2) are formed. The first type transistor 110' includes a dielectric layer 155, high-k dielectric layer 157, first type conductive layer 167, low resistance conductive layer 169, spacer 117 and first type source/drain 119 in the substrate 100 at two sides of the low resistance conductive layer 169. The second type transistor 120' includes a dielectric layer 155, high-k dielectric layer 157, second type conductive layer 161, low resistance conductive layer 163, spacer 127 and second type source/drain 129 in the substrate 100 at two sides of the low resistance conductive layer 163. The high-voltage element 130' includes a dielectric layer 155, high-k dielectric layer 157, second type conductive layer 161, low resistance conductive layer 163, spacer 137 and source/drain 139 in the substrate 100 at two sides of the low resistance conductive layer 163.

The static random access memory 170' is disposed on the substrate 100 and includes at least the high-k dielectric layer 157, low resistance conductive layer 163, second type conductive layer 161, first type conductive layer 167 and another low resistance conductive layer 169. An opening 187 is formed in the interlayer dielectric layer 153 of the substrate 100, extending across the first doped region 107, isolation structure 105 and second doped region 109. The high-k dielectric layer 157 is disposed in the opening 187 along inner sidewalls and a bottom surface of the opening 187. The low resistance conductive layer 163 is disposed above the second doped region 109 and a portion of the isolation structure 105 and fills in the portion of the opening 187 that is located above the second type doped region 109. In one embodiment, a top surface of the low resistance conductive layer 163 and a top surface of the interlayer dielectric layer 153 are positioned at substantially the same level. The second type conductive layer 161 is disposed between the low resistance conductive layer 163 and the high-k dielectric layer 157. The first type conductive layer 167 is disposed above the first type doped region 107 and on the high-k dielectric layer 157, and is disposed along an exposed side surface of the low resistance conductive layer 163 and an exposed upper surface of the high-k dielectric layer 157 in the opening 187. The low resistance conductive layer 169 is disposed on the first type conductive layer 167 and fills in the opening 187. In one embodiment, a top surface of the low resistance conductive layer 169 and the top surface of the low resistance conductive layer 163 are disposed, for example, at substantially the same level.

A dielectric layer 155 may also be disposed between the high-k dielectric layer 157 and the substrate 100 at the bottom of the opening 187, and between the high-k dielectric layer 157 and the spacer 177 at two sides of the opening 187. This dielectric layer 155 is disposed to improve characteristics of the interface between the high-k dielectric layer 157 and the substrate 100, and the high-k dielectric layer 157 and the spacer 177.

Materials of the first doped region 107, second doped region 109, dielectric layer 155, high-k dielectric layer 157, second type conductive layer 161, low resistance conductive layer 163, first type conductive layer 167, low resistance conductive layer 169 have been described in the fabrication process above, so that a detailed description can be omitted.

In the static random access memory 170', the high-k dielectric layer 157 is disposed along the inner sidewalls and bottom surface of the opening, and no excessive high-k dielectric layer will be disposed between the first type conductive layer 167 and the second type conductive layer 161 (between the PN interface). As such, this construction is advantageous in improving the operation performance of the static random access memory 170'.

In addition, the high-k dielectric layer is formed after removal of the dummy gate and the conductive layers of the static random access memory. Therefore, the high-k dielectric layer will not be easily damaged and can avoid multiple high temperature thermal processes. As such, the high-k dielectric layer with good layer quality and good high-resistance characteristics can be fabricated. Moreover, this construction can improve the characteristic of the interface between the high-k dielectric layer and the first type conductive layer, or between the high-k dielectric layer and the second type conductive layer. The electrical performance of the transistor, high-voltage element and static random access memory can also be enhanced.

In one embodiment, if the first type source/drain 119 is a P-type doped region, the subsequently formed first type conductive layer 167 is a P-type conductive layer, i.e., the first type transistor 110' is a P-type transistor, then the quality of the interface between the high-k dielectric layer 157 and the first type conductive layer 167 can be improved because of the reduced number of the high temperature thermal processes. As a result, the break-down voltage of the P-type transistor can be maintained, thus improving the stability of the transistor.

Referring to FIGS. 1F-1 and 1F-2, after forming of the first type transistor 110', the second type transistor 120', the high-voltage element 130' (referring to FIG. 1E-1) and the static random access memory 170' (referring to FIG. 1E-2), the interlayer dielectric layer 153 and mask 151 can further be removed in sequence. The removing method is, for example, wet etching process. In one embodiment, if the mask 151 is a double layered structure consisting of a bottom silicon dioxide and a top silicon nitride, it is possible that only the top silicon nitride is removed, with the bottom silicon dioxide remaining substantially unchanged. Afterwards, a contact etching stop layer (CESL) 191 is formed on the substrate 100. Material of the contact etching stop layer 191 is, for example, silicon nitride. The contact etching stop layer can be used to change the stress to increase the operation speed of the transistor. It should be understood that the method for forming subsequent structures, such as contact, via or lead, is well known to those skilled in the art, and, therefore, is not described herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory comprising:
   a substrate, wherein a first type doped region, a second type doped region, and an isolation structure separating the first type doped region and the second type doped region apart are formed therein;
   an interlayer dielectric layer disposed on the substrate, the interlayer dielectric layer having an opening extending across the first type doped region, the isolation structure and the second doped region such that the substrate is exposed;
   a high-k dielectric layer disposed in the opening along inner sidewalls and a bottom of the opening;
   a first low resistance conductive layer disposed on the second type doped region and a portion of the isolation structure and filling in the opening;
   a second type conductive layer disposed between the first low resistance conductive layer and the high-k dielectric layer;
   a first type conductive layer disposed on the high-k dielectric layer along an exposed sidewall of the first low resistance conductive layer and an exposed upper surface of the high-K dielectric layer in the opening; and
   a second low resistance conductive layer disposed on the first type conductive layer and filling in the opening.

2. The static random access memory in accordance with claim 1, further comprising a dielectric layer disposed between the high-k dielectric layer and the substrate and between the high-k dielectric layer and the interlayer dielectric layer.

3. The static random access memory in accordance with claim 1, wherein the first type doped region is a P-type doped region, and the second type doped region is an N-type doped region.

4. The static random access memory in accordance with claim 3, wherein the first type conductive layer is a P-type conductive layer, and the second type conductive layer is an N-type metal layer.

5. The static random access memory in accordance with claim 4, wherein material of the P-type metal layer comprises tungsten, tungsten nitride, platinum, titanium nitride or ruthenium.

6. The static random access memory in accordance with claim 4, wherein material of the N-type metal layer comprises tantalum nitride, tantalum silicon nitride, tantalum carbide, titanium aluminum nitride, aluminum-titanium alloy, titanium aluminum compound or aluminum.

7. The static random access memory in accordance with claim 1, wherein material of the high-k dielectric layer comprises tantalum oxide, $Ba_{1-x}Sr_xTiO_3$, silicon nitride, silicon oxynitride, silicon carbide, silicon carbon oxide, hafnium oxide, hafnium silicon oxide, hafnium silicon oxynitride, zirconium oxide, zirconium silicon oxide, zirconium hafnium oxide, titanium oxide, cerium oxide, lanthanum oxide, lanthanum aluminum oxide or aluminum oxide.

* * * * *